(12) United States Patent
Dunton et al.

(10) Patent No.: US 7,300,876 B2
(45) Date of Patent: Nov. 27, 2007

(54) METHOD FOR CLEANING SLURRY PARTICLES FROM A SURFACE POLISHED BY CHEMICAL MECHANICAL POLISHING

(75) Inventors: Samuel V. Dunton, San Jose, CA (US); Steven J. Radigan, Fremont, CA (US)

(73) Assignee: Sandisk 3D LLC, Milpitas, CA (US)

( * ) Notice: Subject to any disclaimer, the term of this patent is extended or adjusted under 35 U.S.C. 154(b) by 358 days.

(21) Appl. No.: 11/013,067

(22) Filed: Dec. 14, 2004

(65) Prior Publication Data

US 2006/0128153 A1   Jun. 15, 2006

(51) Int. Cl.
*H01L 21/302* (2006.01)

(52) U.S. Cl. .................. 438/692; 438/959; 438/582

(58) Field of Classification Search ........... 438/692, 438/959
See application file for complete search history.

(56) References Cited

U.S. PATENT DOCUMENTS

| | | | |
|---|---|---|---|
| 5,078,801 A | 1/1992 | Malik | |
| 5,209,816 A | 5/1993 | Yu et al. | |
| 5,244,523 A | 9/1993 | Tollini | |
| 5,632,667 A | 5/1997 | Earl et al. | |
| 5,679,169 A | 10/1997 | Gonzales et al. | |
| 6,083,419 A | 7/2000 | Grumbine et al. | |
| 6,099,662 A | 8/2000 | Wang et al. | |
| 6,178,585 B1 | 1/2001 | Cadien et al. | |
| 6,482,750 B2* | 11/2002 | Yokoi | 438/745 |
| 6,541,434 B2* | 4/2003 | Wang | 510/175 |
| 7,029,373 B2* | 4/2006 | Ma et al. | 451/36 |
| 7,087,564 B2* | 8/2006 | Misra et al. | 510/175 |
| 2003/0154999 A1* | 8/2003 | Shih et al. | 134/1.3 |
| 2004/0058626 A1* | 3/2004 | Filipozzi et al. | 451/57 |
| 2005/0085166 A1* | 4/2005 | Jacquinot et al. | 451/41 |
| 2005/0103743 A1* | 5/2005 | Chamberlain et al. | 216/2 |
| 2006/0021974 A1* | 2/2006 | Liu et al. | 216/88 |
| 2006/0084272 A1* | 4/2006 | Wojtczak et al. | 438/692 |
| 2006/0234604 A1* | 10/2006 | Lee et al. | 451/28 |
| 2007/0037892 A1* | 2/2007 | Belov | 516/79 |

OTHER PUBLICATIONS

Steigerwald, J. M. et al. "Chemical Mechanical Planarization of Microelectronic Materials", John Wiley & Sons, Inc. (1997), 170.

* cited by examiner

*Primary Examiner*—Thao P. Le
(74) *Attorney, Agent, or Firm*—Reising Ethington Barnes Kisselle, P.C.

(57) ABSTRACT

A method is provided to clean slurry particles from a surface in which tungsten and dielectric are coexposed after a dielectric CMP step. Such a surface is formed when tungsten features are patterned and etched, the tungsten features are covered with dielectric, and the dielectric is planarized to expose tops of the tungsten features. The surface to be cleaned is subjected to mechanical action in an acid environment. Suitable mechanical action includes performing a brief tungsten CMP step on the tungsten features or scrubbing the surface using, for example, a commercial post-CMP scrubber.

53 Claims, 3 Drawing Sheets

METHOD FOR CLEANING SLURRY PARTICLES FROM A SURFACE POLISHED BY CHEMICAL MECHANICAL POLISHING

BACKGROUND OF THE INVENTION

The invention relates to a method to clean a surface polished by chemical mechanical polishing (CMP). CMP is used in the fabrication of semiconductor devices to produce a planarized surface.

Typical uses of CMP include planarizing a deposited interlevel dielectric before forming a metal wiring layer on the ILD; or forming a tungsten plug by filling a contact hole etched in dielectric, then planarizing the tungsten overfill, leaving tungsten only in the hole.

During formation of some monolithic three dimensional memory arrays, a dielectric material covers patterned tungsten features, then the dielectric material is subjected to CMP to expose the tungsten features. Exposing tungsten or a like material during dielectric CMP is not conventional. After such a CMP step is completed, it may be found that slurry particles remain adhering to the polished dielectric material. These particles are resistant to usual cleaning techniques.

There is a need, therefore, for a low-cost, reliable method to remove slurry particles from a surface of coexposed tungsten and dielectric following a dielectric CMP step.

SUMMARY OF THE INVENTION

The present invention is defined by the following claims, and nothing in this section should be taken as a limitation on those claims. In general, the invention is directed to a method to clean slurry particles from a surface polished during a dielectric CMP which has exposed tungsten or a like material.

A first aspect of the invention provides for a method for removing slurry particles from a polished surface, the method comprising forming patterned tungsten or tungsten alloy features; depositing a dielectric material over and between the tungsten or tungsten alloy features; performing a first polish by CMP with pH of 7 or greater to coexpose the tungsten or tungsten alloy features and the dielectric material; and after the first polish, performing a mechanical action on the surface with pH of less than 7 to remove slurry particles from the dielectric material.

A related aspect of the invention provides for a semiconductor device comprising a polished surface formed and cleaned by a method, the method comprising forming the surface comprising coexposed a) dielectric and b) tungsten or tungsten alloy by performing a first polish of the surface by CMP wherein pH is about 7 or greater; and performing a mechanical action on the surface after the first polish wherein pH is less than 7, wherein, after the mechanical action, the surface is substantially free of slurry particles.

A preferred embodiment of the invention provides for a method for forming a surface polished by CMP, the method comprising forming patterned tungsten features; depositing dielectric material over and between the patterned tungsten features; performing a dielectric CMP to expose the patterned tungsten features, producing a first dielectric recess between at least some adjacent patterned tungsten features; and performing a tungsten CMP to reduce the first dielectric recess.

Another preferred embodiment provides for a method for forming a memory array, the method comprising depositing a tungsten or tungsten alloy layer; patterning and etching the tungsten or tungsten alloy layer to form patterned features; depositing first dielectric material between and on the patterned features; performing a first CMP step at pH higher than about 7 to coexpose the first dielectric material and tops of the patterned features; and performing a second CMP step at pH lower than about 7.

Other preferred embodiments are provided, and each of the preferred embodiments can be used alone or in combination with one another.

The preferred embodiments will now be described with reference to the attached drawings.

DETAILED DESCRIPTION OF EMBODIMENTS OF THE INVENTION

Formation of a monolithic three dimensional memory array comprising several stacked memory levels is described in Herner et al., U.S. patent application Ser. No. 10/955,549, "Nonvolatile Memory Cell Without a Dielectric Antifuse Having High- and Low-Impedance States," filed Sep. 29, 2004 (hereinafter the '549 application), which is a continuation-in-part of Herner et al., U.S. patent application Ser. No. 10/855,784, filed May 26, 2004; itself a continuation of Herner et al., U.S. patent application Ser. No. 10/326,470, filed Dec. 19, 2002, (hereinafter the '470 application), since abandoned, all hereby incorporated by reference.

Figure 1A:
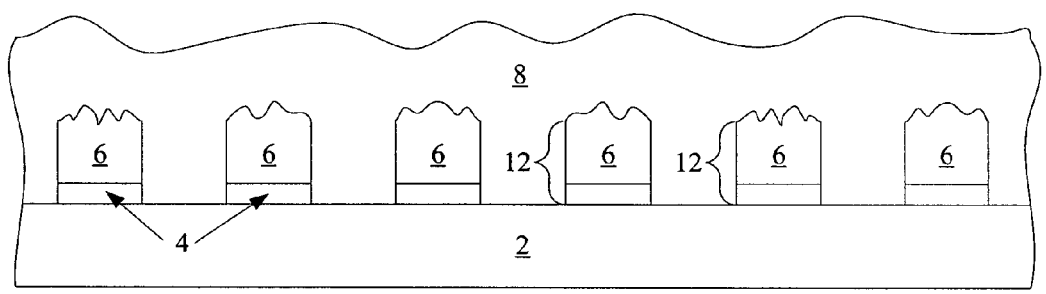
FIGS. 1a-1d are cross-sectional views of tungsten patterned features covered by dielectric fill, subjected to dielectric CMP, and cleaned according to an embodiment of the present invention.

The memory levels of the '470 application include rail-shaped conductors. Turning to FIG. 1a, in embodiments of the '470 application a plurality of substantially parallel, substantially coplanar conductor rails 12 (shown here in cross-section) is formed on an insulating layer 2 by depositing an adhesion layer 4, preferably of titanium nitride and a layer 6 of tungsten. The tungsten forms the bulk of each rail. Tungsten layer 6 and adhesion layer 4 are patterned and etched to form the rails 12, then a dielectric material 8, preferably an HDP oxide, is deposited over and between the rails 12, filling the gaps between them. FIG. 1a shows the structure at this point. (Insulating layer 2 is formed over a suitable substrate, preferably a monocrystalline silicon wafer, not shown.)

Next the dielectric material 8 is removed and planarized by CMP until the tungsten layer 6 of each rail 12 is exposed. A preferred choice for dielectric material 8 is silicon dioxide. During CMP the surface is typically polished with a polishing pad in an abrasive slurry. Different slurries are used to polish different materials. Silicon dioxide CMP is typically performed at relatively high pH, typically between about 9 and about 12. (This discussion will use the term "oxide CMP" to describe a CMP step optimized for planarization and polish of oxide, even if that CMP step is ultimately performed on a surface comprising materials other than oxide. Similarly, the term "tungsten CMP" will refer to a CMP step optimized for planarization and polish of tungsten, even though that CMP step may be performed on a surface comprising materials other than tungsten.)

During oxide deposition, the thickness of the oxide deposited on top of the rails is not constant across the wafer. The rate of removal of oxide during oxide CMP similarly is not constant across the wafer. Thus when tungsten is exposed at a first point on the wafer, it will not yet be exposed at other points. For reliable device performance, good electrical contact must be made to all of the rails 12, so the top surface of each rail 12 is preferably substantially free of oxide. It is thus necessary to continue oxide CMP after first exposure of tungsten to be sure that the tops of all of the tungsten rails 12 are exposed.

Figure 1B:
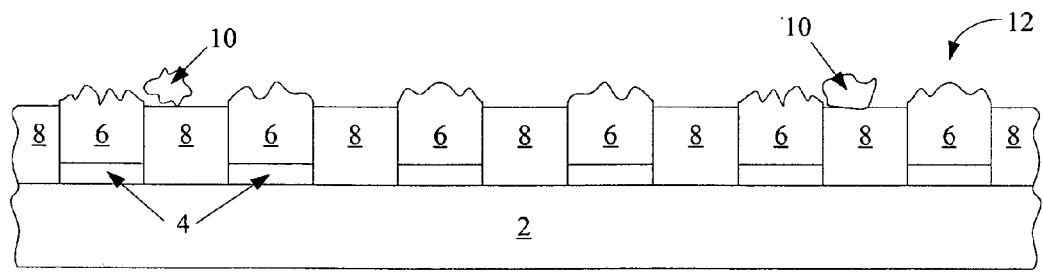

After the oxide CMP step is complete, in at least some parts of the wafer the rails 12 and intervening oxide fill 8 appear as in FIG. 1b. A conventional oxide CMP process is highly selective between oxide and tungsten. Tungsten undergoes almost no planarization during oxide CMP. After CMP, oxide fill 8 is recessed relative to tungsten layer 6. Since the polishing pad is too rigid to bend into the small spaces between rails 12, it is believed that the recess is created largely by a chemical, rather than a mechanical, process. Tungsten tends to have a rough surface, particularly tungsten deposited by chemical vapor deposition, and, as shown in FIG. 1b, the rough surface remains after oxide CMP.

It has been found that after CMP is complete, slurry particles 10, which help abrade the surface during CMP, will remain adhering to the oxide fill 8. Such particles can cause defects in the finished device, and should be removed. Removal can prove difficult, however. Dipping the polished wafer in deionized water or a peroxide or acid solution is not effective in removing a substantial percentage of these adhering slurry particles.

It has been noted that oxide CMP is typically performed at relatively high pH, preferably between about 9 and about 12. Polishing an oxide surface using CMP is well-known. It is not usual, however, to perform oxide CMP in the presence of exposed tungsten, particularly when tungsten makes up a relatively large percentage of the polished surface area. In the high-pH environment of typical oxide CMP, tungsten dissolves into solution, forming tungstate ions.

Without wishing to be bound by any particular theory, it may be that tungstate ions are attracted to either the polished oxide surface or to the slurry particles, which are typically of silica (silicon dioxide), or to both, in turn causing the slurry particles to adhere to the polished oxide surface. In any event, performing oxide CMP in the presence of tungsten changes the charge behavior of the surface or of the slurry particles, or both, such that the slurry particles tend to adhere to the polished silicon dioxide surface.

The methods of the present invention allow for removal of a large percentage or substantially all slurry particles adhering to a surface comprising coexposed tungsten and dielectric after dielectric CMP in an alkaline environment. (Silicon dioxide is the most commonly used dielectric fill, so this example has named silicon dioxide, but it is expected that most dielectrics that are polished using CMP in an alkaline environment, for example other oxides, nitrides or oxynitrides, would behave the same way.)

It has been found that exposing the surface to an acid environment (pH less than about 7, preferably between about 2 and about 4.5, most preferably between about 2.2 and about 4) combined with mechanical action is highly effective in removing adhering slurry particles. Appropriate mechanical action may be, for example, a light CMP step or scrubbing using a device designed for post-CMP scrub, such as an Ontrak DSS-200 scrubber, which scrubs the surface with brushes.

A detailed example will be given of formation of a surface comprising coexposed tungsten and oxide, the surface planarized by high-pH CMP. Such a surface is formed in the process of forming a monolithic three dimensional memory array like those described in the '549 application or the '470 application. The steps and methods used to form this surface are described in more detail in those applications. For clarity, not all of the details of the '549 application or the '470 application will be included, but it will be understood that no teaching of those applications is intended to be excluded.

EXAMPLE

Formation of the memory begins with a substrate. This substrate can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

Returning to FIG. 1a, an insulating layer 2 is formed over the substrate, which is not shown. The insulating layer 2 can be silicon oxide, silicon nitride, high-dielectric film, Si—C—O—H film, or any other suitable insulating material.

The first conductor rails 12 are formed over the substrate and insulator. An adhesion layer 4 is preferably formed on insulating layer 2. Preferred materials for adhesion layer 4 are tantalum nitride, tungsten nitride, titanium tungsten, tungsten, titanium nitride, or combinations of these materials.

Adhesion layer 4 can be deposited by any process known in the art. Where adhesion layer 4 is titanium nitride, it can deposited by depositing a titanium nitride material, or by depositing titanium, which is then subjected to a nitridation process. The titanium nitride can be deposited by any CVD process, physical vapor deposition (PVD) process such as sputtering, or an atomic layer deposition (ALD) process. In one embodiment, the titanium nitride material is deposited by a sputtering process.

The thickness of adhesion layer 4 can range from about 20 to about 500 angstroms. In one embodiment, the thickness of adhesion layer 4 is about 200 angstroms.

The next layer to be deposited is tungsten layer 6. Tungsten layer 6 can be deposited by any CVD process or PVD process. Alternatively, a tungsten alloy can be used. This description will describe layer 6 as tungsten, but it will be understood that a tungsten alloy can be used instead. The thickness of tungsten layer 6 can range from about 200 to about 2000 angstroms, preferably about 1500 angstroms.

Next tungsten layer 6 and adhesion layer 4 are patterned and etched using any suitable masking and etching process to form substantially parallel, substantially coplanar rail-shaped conductors 12, shown in FIG. 1a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

The width of conductor rails 12 after etch preferably ranges from about 300 to about 2500 angstroms. The width of the gaps between conductor rails 200 preferably is substantially the same as the width of conductor rails 200 themselves, though it may be greater or less. In one embodiment, the width of conductor rails is between about 900 and about 1500 angstroms, preferably about 1300 angstroms.

Next a dielectric material 8 is deposited over and between conductor rails 12. Dielectric material 8 can be any known electrically insulating material, such as silicon oxide, silicon nitride, or silicon oxynitride. In a preferred embodiment, silicon oxide is used as dielectric material 8. The silicon oxide can be deposited using any known process, such as CVD, or, for example, high density plasma CVD (HD-PCVD). While it will be understood that other dielectric materials can be used, this discussion will describe dielectric material 8 as an oxide.

Finally, excess oxide 8 on top of conductor rails 12 is removed by CMP, exposing the tops of conductor rails 12 separated by oxide 8. This CMP step is performed at pH greater than about 7, preferably between about 9 and about 12, most preferably between about 10 and about 11. The resulting structure is shown in FIG. 1b.

At this point, it is expected that some slurry particles 10 will remain, adhering to oxide 8. Methods of the present invention remove adhering slurry particles by exposing the surface to an acid environment combined with mechanical action. In a preferred embodiment, a tungsten CMP step is performed. This CMP step is performed in an acid environment, with pH less than about 7, preferably between about 2 and about 4.5, preferably between about 2.2 and about 4. On one occasion, tungsten CMP was performed using Rodel MSW15000 slurry, which has a $KIO_3$ oxidizer and an alumina abrasive, with a pH of about 4. On another occasion, Cabot W2585 or Cabot W2000 slurry (both having $H_2O_2$ oxidizer and silica abrasive) were used instead. All three slurries were found to be effective.

To summarize, slurry particles were removed from a polished surface by a method comprising forming patterned tungsten or tungsten alloy features; depositing a dielectric material over and between the tungsten or tungsten alloy features; performing a first polish by CMP with pH of 7 or greater to coexpose the tungsten or tungsten alloy features and the dielectric material; and after the first polish, performing a mechanical action on the surface with pH of less than 7 to remove slurry particles from the dielectric material. Note that tungsten or tungsten alloy features are patterned features with tungsten or tungsten alloy on top; other layers of other materials (such as adhesion layer 4 in this example) may be included in such features.

Figure 1C:
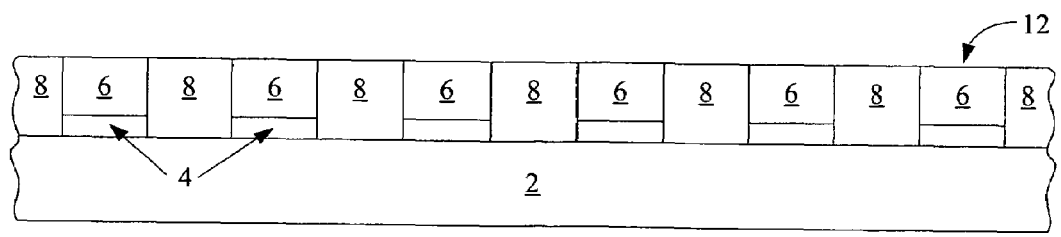
Figure 1D:
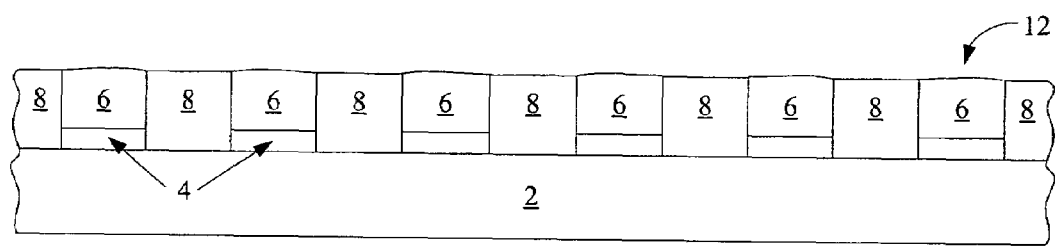

It is believed that the attraction of slurry particles 10 to the surface is largely a chemical affinity due to changed charge conditions of the polished surface or of the slurry particle, or both. As noted, however, dipping in an acid solution alone is not sufficient to effectively remove slurry particles; mechanical action is required as well. The recess of oxide 8 apparently increases the challenge; the deeper the recess, the more difficult it is to remove slurry particles 10. The amount of tungsten CMP performed, then, depends on the depth of the oxide recess. If the oxide recess is not deep, a very brief tungsten CMP will suffice. In a preferred embodiment, shown in FIG. 1c, after tungsten CMP substantially no oxide recess remains. A briefer tungsten CMP step may leave some topography, as in FIG. 1d. In either case, the first and second CMP have defined a planarized surface.

While performing tungsten CMP to remove substantially all oxide recess, creating a substantially planar surface, is preferred, it is believed that the removal of slurry particles is achieved by the combination of an acid environment and mechanical action, not solely by reduction of topography. When the oxide recess is not too severe, an acid scrub (using a commercial post-CMP scrubber such as the Ontrak DSS-200, for example) is effective in removing slurry particles, even though virtually no tungsten is removed by such a scrub. It was found that performing a post-polish buff was also effective. The buff was performed on the CMP tool with HCl, with pH about 2.5, and this process similarly removes virtually no tungsten.

Figure 2:
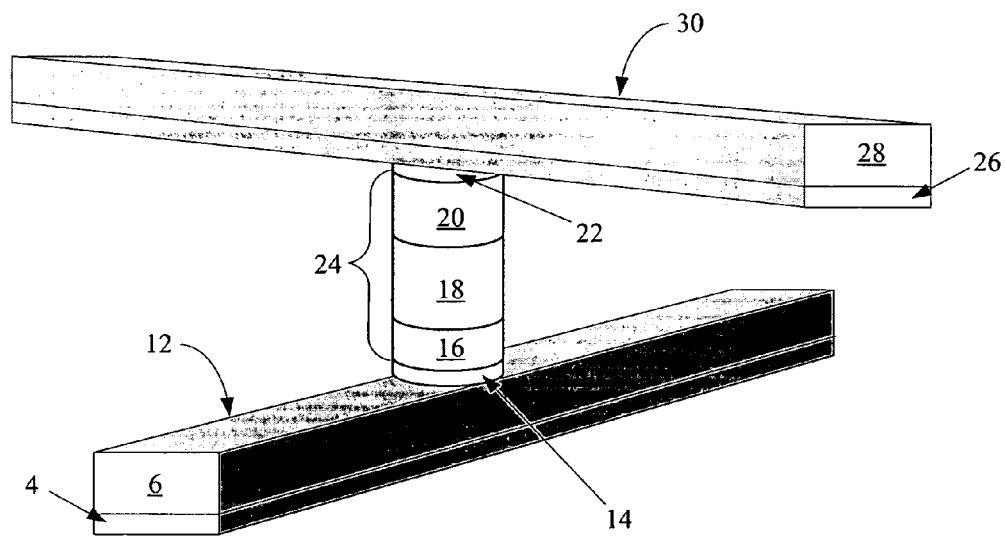
FIG. 2 is a perspective view of a memory cell according to the '470 application, including lower conductors advantageously formed and cleaned according to methods of the present invention.
Figure 3:
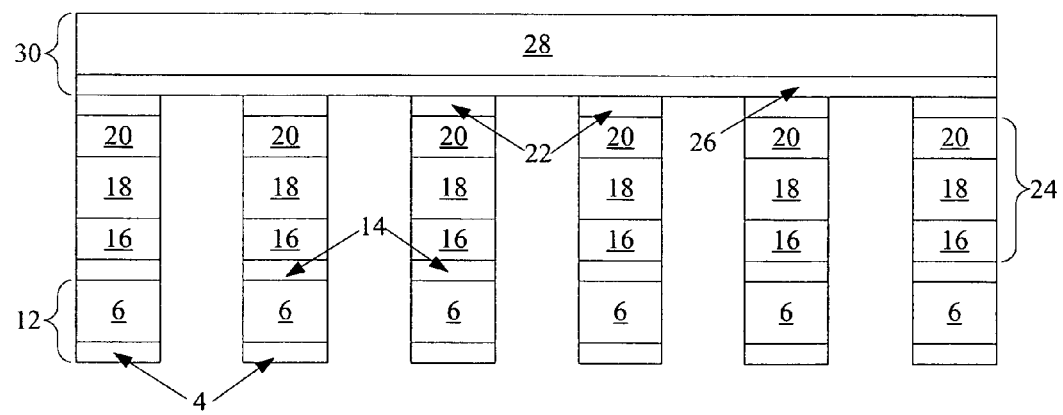
FIG. 3 is a cross-sectional view of one memory level of an array of cells like those in FIG. 2.

Once the surface has been cleaned, the remaining elements of a memory level can be formed as in the '549 or the '470 application. FIG. 2 shows a single memory cell formed according to a preferred embodiment of the '470 application. Conductor rail 12 was formed as described above (dielectric material 8 is not shown.) Titanium nitride barrier layer 14 separates silicon junction diode 24 (which includes bottom heavily doped region 16 of a first conductivity type, middle intrinsic region 18, and top heavily doped region 20 of a second conductivity type) from tungsten layer 6. Junction diode 24 is formed of polycrystalline silicon, which in this discussion will be referred to as polysilicon. A silicon dioxide dielectric antifuse layer 22 is grown or deposited on junction diode 24. A top conductor rail 30, comprising titanium nitride adhesion layer 26 and tungsten layer 28, can be formed using the methods used to form bottom conductor rail 12. FIG. 3 shows, in cross-section, a plurality of cells like those shown in FIG. 2. Bottom conductor rails 12 extend in a direction perpendicular to the page, while top conductor rails 30 extend left to right across the page. These conductors serve as wordlines or bitlines in the memory array.

After formation and cleaning of rails 12, titanium nitride layer 14 is deposited, along with the polysilicon that will form junction diode 24. Titanium nitride layer 14 and polysilicon layers 16, 18, and 20 must then be patterned and etched to form pillars aligned with underlying rail conductors 12, though some misalignment can be tolerated. Polysilicon, however, is opaque at thickness over about 1500 angstroms, so any alignment marks at the level of conductor rails 12 will not be visible and cannot be used for alignment. The necessity of performing an open frame etch can be avoided if topography exists after deposition of the polysilicon. This topography can be used by the alignment system to locate the alignment marks and achieve alignment. Thus it may be advantageous, after the tungsten CMP step, to selectively etch the dielectric material (the oxide), for example by performing an HF dip, creating a controlled and uniform oxide recess of about 200 angstroms or greater, preferably between about 200 and about 300 angstroms. This dielectric recess creates topography which is replicated in overlying layers.

FIG. 3 shows a first memory level. Another memory level can be formed above the first memory level. The same methods can be used in subsequent memory levels: Another plurality of rails can be formed above the first rails, this plurality of rails comprising tungsten and separated by a dielectric material. As before, one CMP step is performed to coexpose the dielectric material and tops of the rails; and a following CMP step planarizes the rails. A planarized surface is defined by these two CMP steps, and the pillars of the next memory levels are formed on this surface. Adjacent memory levels can share a level of conductors (the top conductor of the lower memory level serving as the bottom conductor of the upper memory level) or an interlevel dielectric may separate adjacent memory levels.

Multiple memory levels can be stacked, one atop the other, to form a monolithic three dimensional memory array as described in the '549 application and the '470 application. Circuit arrangements advantageously used in such a memory are described in Scheuerlein, U.S. patent application Ser.

No. 10/403,844, "Word Line Arrangement Having Multi-Layer Word Line Segments for Three-Dimensional Memory Array," filed Mar. 31, 2003, which is assigned to the assignee of the present invention and is hereby incorporated by reference.

The completed memory array is an example of a semiconductor device comprising a polished surface formed and cleaned by a method, the method comprising forming the surface comprising coexposed a) dielectric and b) tungsten or tungsten alloy by performing a first polish of the surface by CMP wherein pH is about 7 or greater; performing a mechanical action on the surface after the first polish wherein pH is less than 7, wherein, after the mechanical action, the surface is substantially free of slurry particles.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Petti et al., U.S. patent application Ser. No. 10/728,230, "Semiconductor Device Including Junction Diode Contacting Contact-Antifuse Unit Comprising Silicide," filed Dec. 3, 2003; Herner et al., U.S. patent application Ser. No. 10/954,577, "Junction Diode Comprising Varying Semiconductor Compositions," filed Sep. 29, 2004; Herner, U.S. patent application Ser. No. 10/954,510, "Memory Cell Comprising a Semiconductor Junction Diode Crystallized Adjacent to a Silicide," filed Sep. 29, 2004; and Petti, U.S. patent application Ser. No. 10/955,387, "Fuse Memory Cell Comprising a Diode, the Diode Serving as the Fuse Element," filed Sep. 29, 2004, all assigned to the assignee of the present invention and hereby incorporated by reference. As appropriate, the methods of the present invention can be used in conjunction with the memories described in these patents and applications to form monolithic three dimensional memory arrays according to the present invention.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The present invention has been described in the context of a monolithic three dimensional memory array formed above a substrate. Such an array comprises at least a first memory level formed at a first height above the substrate and a second memory level formed at a second height different from the first height. Any number of memory levels, for example up to eight or more, can be formed above the substrate in such a multilevel array.

It will be apparent to those skilled in the art, however, that the methods of the present invention will prove useful whenever an alkaline CMP step is used to coexpose tungsten and a dielectric material, whether in a memory array or some other device. Utility of the present invention is in no way limited to memory applications or to stacked three-dimensional structures.

Like tungstate ions, chromate and molybdenate ions exhibit high affinity for silicon dioxide. It is thus expected that if patterned features made of chromium or molybdenum are covered with dielectric, and then these chromium or molybdenum features are coexposed by CMP, chromate ions or molybdenate ions may change the surface charge the same way it is believed that tungstate ions do, causing slurry particles to adhere to the polished dielectric surface. It is expected that exposing the surface to subsequent mechanical action in an acid environment, for example an acidic chromium or molybdenum CMP step, or an acid scrub, would remove the adhering slurry particles.

The methods of the present invention have been described in the context of forming substantially parallel tungsten rails separated by a dielectric material. Clearly, the same methods could be used to clean surfaces in which CMP is used to coexpose tungsten and a dielectric material in which the patterned features take other shapes.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for removing slurry particles from a polished surface, the method comprising:
   forming patterned tungsten or tungsten alloy features;
   depositing a dielectric material over and between the tungsten or tungsten alloy features;
   performing a first polish by CMP with a pH of 7 or greater to coexpose the tungsten or tungsten alloy features and the dielectric material; and
   after the first polish, performing a mechanical action on the surface with pH of less than 7 to remove slurry particles from the dielectric material.

2. The method of claim 1 wherein the mechanical action is a second polish by CMP.

3. The method of claim 1 wherein the step of forming patterned tungsten or tungsten alloy features comprises:
   depositing a tungsten or tungsten alloy layer; and
   patterning and etching the tungsten or tungsten alloy layer to form the patterned tungsten or tungsten alloy features.

4. The method of claim 3 wherein the tungsten or tungsten alloy layer is substantially tungsten.

5. The method of claim 1 wherein the patterned tungsten or tungsten alloy features comprise a plurality of substantially parallel, substantially coplanar rails.

6. The method of claim 5 wherein the rails comprise conductors.

7. The method of claim 6 wherein the conductors are wordlines or bitlines in a memory array.

8. The method of claim 7 wherein the memory array is a monolithic three dimensional memory array.

9. The method of claim 5 further comprising forming a dielectric recess by selectively etching the dielectric material.

10. The method of claim 9 wherein the selective etching is performed by an HF solution.

11. The method of claim 10 wherein the dielectric recess is about 200 angstroms or greater.

12. The method of claim 11 wherein the dielectric recess is between about 200 and about 300 angstroms.

13. The method of claim 1 wherein the dielectric material comprises silicon dioxide.

14. The method of claim 1 wherein the pH of the first polish is between about 9 and about 12.

15. The method of claim 14 wherein the pH of the first polish is between about 10 and about 11.

16. The method of claim 1 wherein the pH of the mechanical action is between about 2 and about 4.5.

17. The method of claim 16 wherein the pH of the first polish is between about 9 and about 12.

18. The method of claim 1 wherein the mechanical action is scrubbing by a post-CMP scrubber.

19. A semi-conductor device comprising a polished surface formed and cleaned by a method, the method comprising:
    forming the surface comprising coexposed a)dielectric and b) tungsten or tungsten alloy by performing a first polish of the surface by CMP wherein pH is about 7 or greater; and
    performing a mechanical action on the surface after the first polish wherein pH is less than 7, wherein, after the mechanical action, the surface is substantially free of slurry particles.

20. The device of claim 19 wherein the step of forming the surface comprises:
    depositing tungsten or a tungsten alloy;
    patterning and etching the tungsten or tungsten alloy to form tungsten or tungsten alloy features; and
    depositing the dielectric over and between the tungsten or tungsten alloy features.

21. The device of claim 20 wherein the first polish removes dielectric and exposes the top of the tungsten or tungsten alloy features.

22. The device of claim 21 wherein the tungsten or tungsten alloy features comprise a plurality of substantially parallel, substantially coplanar rails.

23. The device of claim 22 wherein the method further comprises selectively etching the dielectric after the mechanical action, forming a dielectric recess.

24. The device of claim 23 wherein the dielectric recess is about 200 angstroms or greater.

25. The device of claim 24 wherein the dielectric recess is about 200 and about 300 angstroms.

26. The device of claim 19 further comprising a plurality of semiconductor pillars above the rails.

27. The device of claim 19 comprising a memory array.

28. The device of claim 27 wherein the memory array is a monolithic three dimensional memory array.

29. The device of claim 19 wherein the mechanical action is a second polish by CMP.

30. The device of claim 19 wherein the dielectric comprises silicon dioxide.

31. The device of claim 19 wherein the surface is formed above a substrate.

32. The device of claim 31 wherein the substrate comprises monocrystalline silicon.

33. The device of claim 19 wherein the pH of the first polish is between about 9 and about 12.

34. The device of claim 33 wherein the pH of the first polish is between about 10 and about 11.

35. The device of claim 19 wherein the pH of the mechanical action is between about 2 and about 4.5.

36. The method of claim 35 wherein the pH of the first polish is between about 9 and about 12.

37. The method of claim 19 wherein the mechanical action is scrubbing by a post-CMP scrubber.

38. A method for forming a memory array, the method comprising:
    depositing a tungsten or tungsten alloy layer;
    patterning and etching the tungsten or tungsten alloy layer to form patterned features;
    depositing first dielectric material between and on the patterned features;
    performing a first CMP step at pH higher than about 7 to coexpose the first dielectric material and tops of the patterned features; and
    performing a second CMP step at pH lower than about 7.

39. The method of claim 38 wherein the patterned features comprise a plurality of first substantially parallel, substantially coplanar rails.

40. The method of claim 39 wherein a first planarized surface is defined by the first and the second CMP steps.

41. The method of claim 40 wherein, after the second CMP step, the first planarized surface is substantially free of slurry particles.

42. The method of claim 41 further comprising forming a second plurality of rails above the first rails, the second plurality of rails comprising tungsten and separated by a second dielectric material.

43. The method of claim 42 further comprising:
    performing a third CMP step to coexpose the second dielectric material and tops of the second rails; and
    performing a fourth CMP step.

44. The method of claim 43 wherein a second planarized surface is defined by the third and the fourth CMP steps.

45. The method of claim 44 wherein, after the fourth CMP step, the second planarized surface is substantially free of slurry particles.

46. The method of claim 45 wherein the third CMP step is performed at pH of about 7 or greater.

47. The method of claim 46 wherein the fourth CMP step is performed at pH of about 7 or less.

48. The method of claim 44 wherein the first dielectric material comprises silicon dioxide.

49. The method of claim 38 wherein the first dielectric material comprises silicon dioxide.

50. The method of claim 38 wherein the first CMP step is performed at pH between about 9 and 12.

51. The method of claim 38 wherein the second CMP step is performed at pH between about 2 and 4.5.

52. The method of claim 51 wherein the first CMP step is performed at pH between about 9 and about 12.

53. The method of claim 52 wherein the first CMP step is performed at pH between about 10 and about 11.

* * * * *